(12) United States Patent
Pollock et al.

(10) Patent No.: US 7,381,977 B2
(45) Date of Patent: Jun. 3, 2008

(54) ION BEAM PROFILER

(75) Inventors: John D. Pollock, Rowley, MA (US);
John W. Vanderpot, Boxford, MA (US); Donald W. Berrian, Topsfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 316 days.

(21) Appl. No.: 11/235,754

(22) Filed: Sep. 27, 2005

(65) Prior Publication Data

US 2007/0069156 A1 Mar. 29, 2007

(51) Int. Cl.
*H01J 37/317* (2006.01)

(52) U.S. Cl. .................. 250/492.21; 250/397

(58) Field of Classification Search ........... 250/492.21, 250/397

See application file for complete search history.

(56) References Cited

U.S. PATENT DOCUMENTS 4,361,762 A * 11/1982 Douglas ............... 250/251
4,916,322 A *  4/1990 Glavish et al. ........ 250/492.2

* cited by examiner

*Primary Examiner*—Kiet T. Nguyen
(74) *Attorney, Agent, or Firm*—Eschweiler & Associates, LLC (57) ABSTRACT

A system, method, and apparatus for determining a profile of an ion beam are provided. The apparatus comprises a measuring device positioned along a path of the ion beam, a drive mechanism, and a first plate rotatably coupled to the drive mechanism. The drive mechanism is operable to rotate the first plate about a first axis through a path of the ion beam, therein selectively blocking the ion beam from reaching the measuring device. The apparatus may comprise a second plate further rotatably coupled to the drive mechanism, wherein the drive mechanism is operable to rotate the second plate about the first axis through the path of the ion beam independently from the rotation of the first plate, therein further selectively blocking the ion beam from reaching the measuring device. The drive mechanism may further linearly translate first plate and/or second plate through the ion beam.

25 Claims, 8 Drawing Sheets

ION BEAM PROFILER

FIELD OF THE INVENTION

The present invention relates generally to ion implantation systems, and more specifically to a system, apparatus, and method for determining a profile of an ion beam.

BACKGROUND OF THE INVENTION

In the semiconductor industry, various manufacturing processes are typically carried out on a workpiece (e.g., a semiconductor wafer) in order to achieve various results thereon. Processes such as ion implantation, for example, can be performed in order to obtain a particular characteristic on or within the workpiece, such as limiting a diffusivity of a dielectric layer on the workpiece by implanting a specific type of ion. Conventionally, ion implantation processes are performed in either a batch process, wherein multiple workpieces are processed concurrently, or in a serial process, wherein a single workpiece is individually processed.

Traditional high-energy or high-current ion implanters typically utilized in batch ion implantation processes, for example, are operable to achieve an ion beam-line, wherein a plurality of workpieces are placed on a wheel or disk, and wherein the wheel is spun and radially translated through the ion beam, thus exposing all of the surface area of the workpieces to the ion beam at various times throughout the process. In a typical serial ion implantation process, on the other hand, an ion beam is typically scanned in two dimensions relative to a single workpiece. For example, in one conventional serial ion implantation system, the workpiece is uniformly translated in two dimensions with respect to a generally stationary ion beam, wherein a constant dose of ions from the ion beam is typically desired. Accordingly, the relative movement between the ion beam and the workpiece is typically desired to be constant when the ion beam is impinging on the workpiece. Such a constant relative movement between the ion beam and the workpiece is desirable in order to provide a substantially uniform implantation of ions across the surface of the workpiece.

However, the current or charge of a typical ion beam at the plane of the workpiece can vary significantly across a cross-section of the beam, and such variation can lead to a potential non-uniform implantation of ions to the workpiece in both batch processes and serial processes. Therefore, it is generally desirable to understand a profile and/or trajectory of the ion beam when it impacts the workpiece (i.e., at the workpiece plane). For example, an understanding of a charge distribution across a cross-section of the ion beam at the workpiece plane and/or a trajectory of the ion beam at the workpiece plane is desirable in order to determine an appropriate scan path of the ion beam with respect to the workpiece surface for implanting a proper dosage of ions and/or achieving a proper implant angle for the workpiece. Conventionally, such a profile measurement of the ion beam has been cumbersome and/or time consuming, and has frequently been based on assumptions of how the ion beam should appear for a given set of input parameters.

Therefore, a need currently exists for an apparatus, system, and method for determining a profile and/or trajectory of an ion beam at the workpiece plane, wherein a charge distribution across the ion beam can be empirically determined in a highly efficient manner.

SUMMARY OF THE INVENTION

The present invention provides an apparatus, system, and method for determining a charge distribution of an ion beam as a function of a position associated with a plane of a workpiece. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

According to one exemplary aspect of the invention, an ion beam profiling apparatus is provided for determining a profile of an ion beam emitted from an ion source. The apparatus comprises a measuring device positioned along a path of the ion beam, a first plate operable to rotate through the ion beam path about a first axis, and a drive mechanism operable to rotate the first plate through the path of the ion beam. The drive mechanism, for example, comprises a rotary actuator or motor. Accordingly, the measuring device is operable to detect a beam current of the ion beam during the rotation of the first plate, wherein the first plate selectively blocks at least a portion of the ion beam during the rotation thereof, and wherein a beam current profile of the ion beam in a horizontal direction (x-direction) can be determined.

According to another aspect of the invention, the drive mechanism further comprises a linear actuator operably coupled to the first plate, wherein the linear actuator is operable to selectively linearly translate the first plate through the ion beam along, or parallel to, the first axis. Accordingly, the first plate selectively blocks the ion beam during the linear translation thereof, wherein a beam current profile of the ion beam in a vertical direction (y-direction) can be determined.

In accordance with another exemplary aspect of the invention, the beam profiling apparatus further comprises a second plate rotatably coupled to the drive mechanism, wherein the drive mechanism is further operable to rotate the second plate about the first axis through the path of the ion beam independently from the rotation of the first plate. Such a rotation of the second plate, for example, therein further selectively blocks at least another portion of the ion beam from reaching the measuring device, wherein a twist angle of the ion beam can determined based, at least in part, on the rotational position of the first plate and the second plate when a maximum beam current is sensed by the measuring device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention is directed generally towards an apparatus, system, and method for determining a profile and/or trajectory of an ion beam as it relates to an implantation of ions into workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 1:
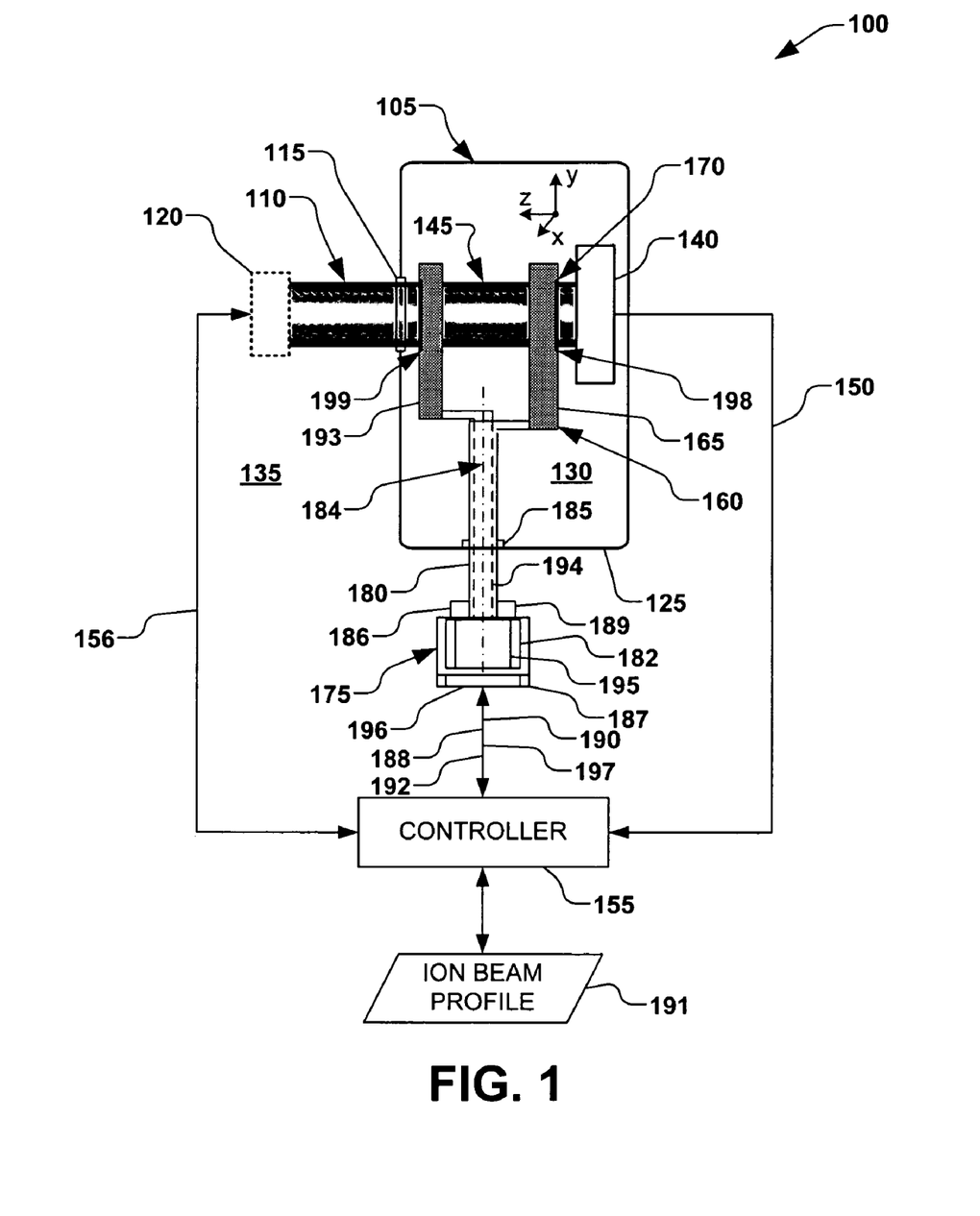
FIG. 1 is a simplified perspective view of an exemplary ion implantation system according to one aspect of the present invention.

Referring now to the figures, FIG. 1 illustrates an ion implantation system 100 according to one exemplary aspect of the present invention. It should be noted that the ion implantation system 100 of FIG. 1 is illustrated to provide an upper-level understanding of the invention, and is not necessarily drawn to scale. Accordingly, various components may or may not be illustrated for clarity purposes. Furthermore, it shall be understood that the various features illustrated can be of various shapes and sizes, or excluded altogether, and that all such shapes, sizes, and exclusions are contemplated as falling within the scope of the present invention.

The ion implantation system 100, for example, comprises a process chamber 105, wherein an ion beam 110 is introduced into the process chamber via an aperture 115 associated therewith. The ion beam 110, for example, may comprise a group of ions traveling together along close, substantially parallel, trajectories taking the form of a spot or so-called "pencil beam", as may be formed by any suitable ion beam formation system 120 known in the art, wherein the details of which will not be discussed here. The ion beam 110, for example, may be utilized to implant ions into a generally planar workpiece (not shown) positioned within the process chamber 105. According to the present invention, the process chamber 105 may comprise a generally enclosed vacuum chamber 125, wherein an internal environment 130 within the process chamber is operable to be generally isolated from an external environment 135 outside the process chamber. For example, the vacuum chamber 125 can be configured and equipped so as to maintain the internal environment 130 at a substantially low pressure (e.g., a vacuum). The process chamber 105 may be further coupled to one or more load lock chambers (not shown), wherein a workpiece (not shown) may be transported between the internal environment 130 of the process chamber and the external environment 135 without substantial loss of vacuum within the process chamber. The process chamber 105 may be alternatively comprised of a generally non-enclosed process space (not shown), wherein the process space is generally associated with the external environment 135.

In accordance with the present invention, a measuring device 140 (e.g., a faraday cup) is provided and positioned within a path 145 of the ion beam 110, wherein the measuring device is operable to generally sense a beam current 150 associated with the ion beam. The sensed beam current 150, for example, can be processed by a controller 155, wherein the controller is operable to maintain and/or control the ion beam 110 via one or more beam control signals 156 to the ion beam formation system 120. In accordance with another exemplary aspect of the invention, a beam profiler 160 for determining a profile of the ion beam 110 is provided, wherein the beam profiler, in one example, further comprises the measuring device 140. The beam profiler 160 comprises a first plate 165, wherein the first plate generally resides along or near a workpiece plane 170 (e.g., the x-y plane). The workpiece plane 170, for example, is associated with a surface (not shown) of a workpiece (not shown) when the workpiece is positioned within the process chamber 105 for ion implantation thereto, as will be understood by one of ordinary skill in the art.

The beam profiler 160 is further operably coupled to a drive mechanism 175, wherein the drive mechanism is operable to translate and/or rotate the first plate 165 through the path 145 of the ion beam 110, therein selectively blocking at least a portion (not shown) of the ion beam from entering or reaching the measuring device 140, the details of which will be described infra. The drive mechanism 175 of the beam profiler 160, in one example, is partitioned between the process chamber 105 and the external environment 135, such that minimum of wear and contamination occurs within the internal environment 130. For example, the drive mechanism 175 comprises a first shaft 180 operably coupled to the first plate 165, wherein the first shaft is further rotatably coupled to a first rotary motor 182 (e.g., a servo motor), wherein the first rotary motor is operable to selectively rotate the first shaft about a first axis 184 and hence, rotate the first plate through the ion beam 110. The first shaft 180 is generally sealed between the process chamber 105 and the external environment 135 by a seal 185 associated with the first shaft and the process chamber, wherein the internal environment 130 within the process chamber is generally isolated from the external environment.

In accordance with another exemplary aspect of the invention, the drive mechanism 175 further comprises a linear actuator 186 operably coupled to the first shaft 180, wherein the linear actuator is operable to selectively linearly translate the first shaft along the first axis 184, thus linearly translating the first plate 165 through the ion beam 100 in a direction generally parallel to the first axis (e.g., along the y-axis). The linear actuator 186, for example, may comprise a servo motor, a ball screw, or other translational system, wherein the first plate 165 can be smoothly translated along, or parallel to, the first axis. Accordingly, the rotation and/or translation of the first plate 165 through the ion beam 110 generally allows the controller 155 to determine a profile of the ion beam (e.g., in the x-y plane), based on the varying beam current 150 sensed by the measurement device 140 as the first plate passes through the ion beam, as will be discussed in more detail infra.

A first encoder 187 associated with one or more of the first plate 165, first shaft 180, and first rotary motor 182, for example, is operable to sense a first rotational position 188 of the first plate about the first axis 184. Furthermore, a linear encoder 189 associated with drive mechanism 175, for example, is operable to sense a linear position 190 of one or more of the first plate 165 and first shaft 180. Such a first rotational position 188 and linear position 190 of the first plate 165, for example, can be utilized by the controller 155 to determine the profile 191 of the ion beam 110 at the workpiece plate 170 (e.g., a profile of the ion beam current 150 across the ion beam), based on the sensed beam current and a knowledge of physical dimensions of the first plate. The controller 155, for example, is further operable to control the rotation and translation of the first plate 165 via one or more control signals 192 provided to the drive mechanism 175.

Furthermore, a so-called "tilt angle", as will be understood by those of skill in the ion implantation art, can be characterized by the beam profiler 160, wherein a rotatable second plate 193 is further provided for determining an angle of trajectory of the ion beam 110 with respect to the workpiece plane 170 (e.g., in the z-direction). For example, when the ion beam 110 impinges on the workpiece (not shown) at a non-orthogonal angle (not shown), and/or when a crystalline or other structure associated with the workpiece (e.g., a semiconductor substrate, or a substrate having structures formed thereon), the tilt angle plays a role in the uniformity of the ion implantation. The second plate 193, for example, is rotatably coupled to the drive mechanism 175, wherein the drive mechanism is further operable to rotate the second plate about the first axis 184 through the path 145 of the ion beam 110. The second plate 193 may be rotated independently from the first plate 165, wherein the second plate is further operable to selectively block at least another portion (not shown) of the ion beam from reaching the measuring device 140.

The drive mechanism 175, for example, further comprises a second shaft 194 operably coupled to the second plate 193, wherein the second shaft is further rotatably coupled to a second rotary motor 195 (e.g., a servo motor), wherein the second rotary motor is operable to selectively rotate the second shaft about a first axis 184 and hence, rotate the second plate through the ion beam 110. Furthermore, a second encoder 196 associated with one or more of the second plate 193, second shaft 194 and second rotary motor 195, for example, is operable to sense a second rotational position 197 of the second plate about the first axis 184. The second shaft 193, in another example, is also generally sealed between the process chamber 105 and the external environment 135 by the seal 185, wherein the internal environment 130 within the process chamber is generally isolated from the external environment 135.

Figure 2A:
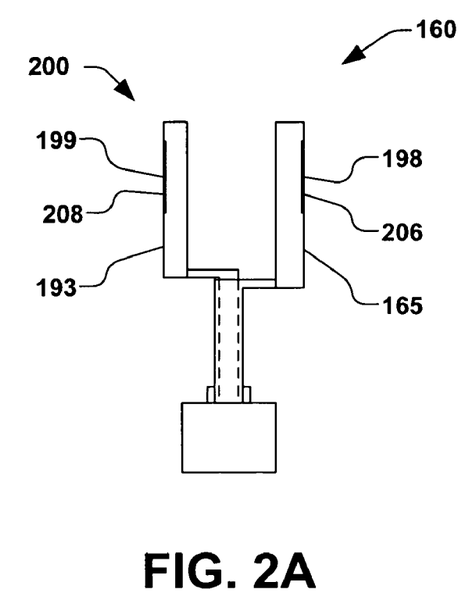
FIGS. 2A-2C are respective side elevation, front elevation, and top plan views of the beam profiler apparatus of FIG. 1 according to another aspect of the invention.
Figure 2B:
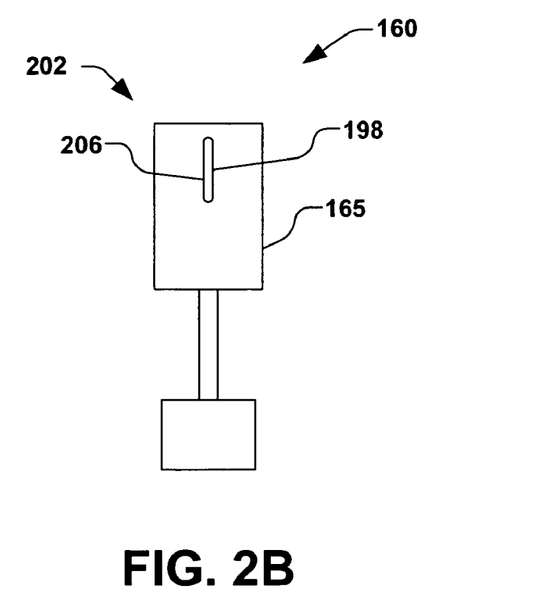
Figure 2C:
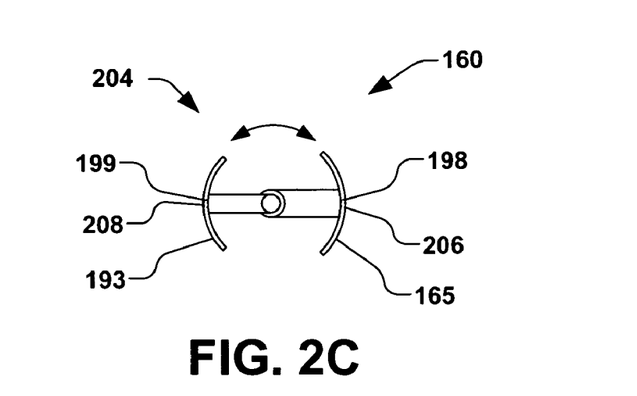

The first plate 165 and the second plate 193 comprise a respective first aperture 198 and second aperture 199 defined therein, wherein the first aperture and second aperture are further rotatable through the ion beam 110. The first aperture 198 and second aperture 199, in conjunction with the measuring device 140 and the controller 155, for example, generally permit the angle of trajectory of the ion beam 110 with respect to the workpiece plane 170 to be determined, as will be discussed hereafter. FIGS. 2A-2C illustrate a respective side elevation view 200, front elevation view 202, and top plan view 204 of the beam profiler apparatus 160 of FIG. 1, wherein the various features described above can be more clearly understood. For example, as illustrated in FIG. 2B, the first aperture 198 associated with the first plate 165 is shown, wherein the first aperture comprises a generally elongate first slit 206. The second aperture 199 associated with the second plate 193 in FIG. 2C, for example, may comprise a generally elongate second slit 208 having dimensions similar to that of the first slit 206.

Figure 3:
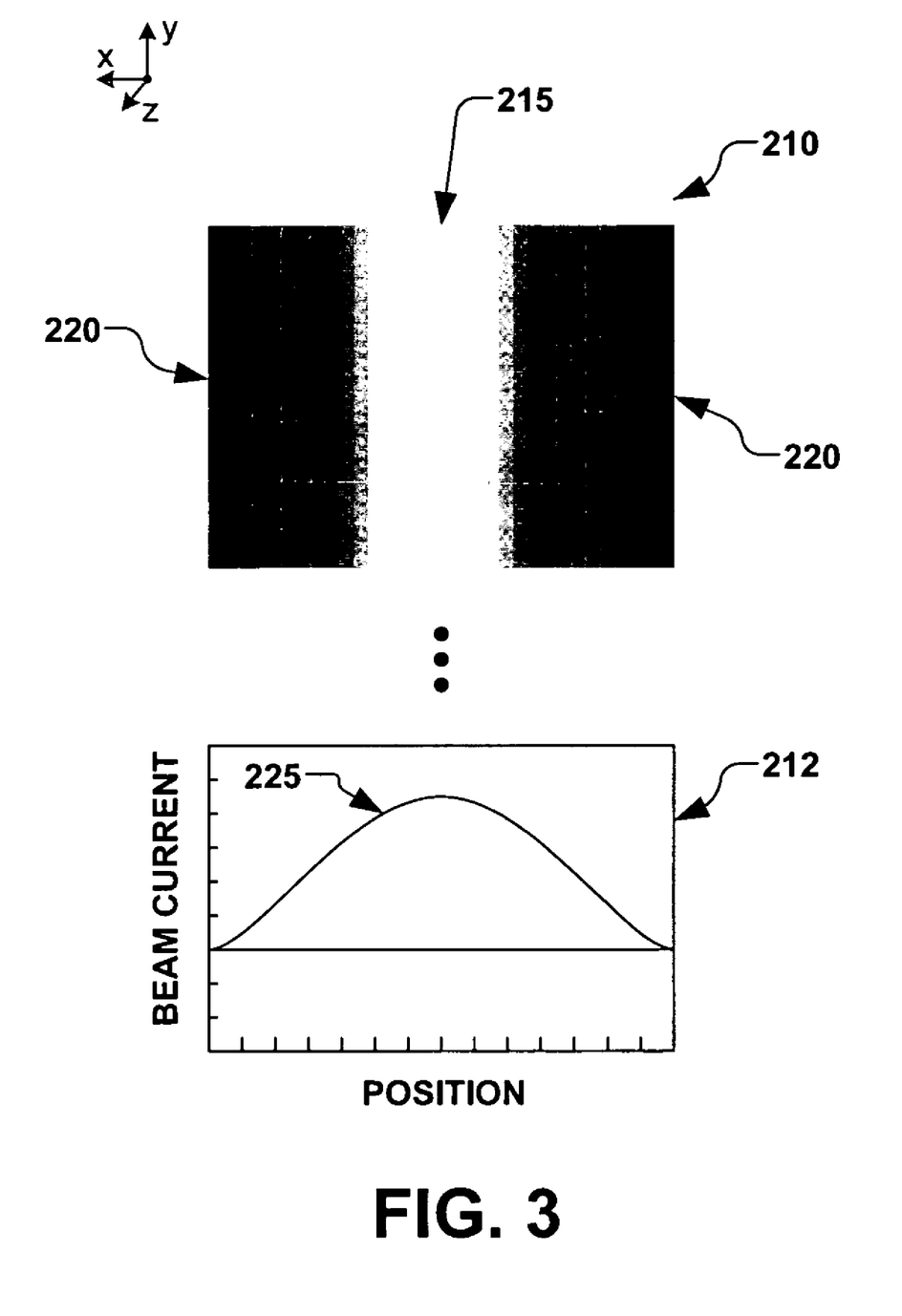
FIG. 3 is a partial elevation view of an exemplary ion beam cross section and associated beam current profile according to another exemplary aspect of the invention.

In accordance with the present invention, the beam profiler apparatus 160 of FIGS. 1 and 2A-2C may be utilized to gain an understanding of the current profile (also called a dimensional profile or spatial profile) of the ion beam 110 of FIG. 1 at or near the workpiece plane 170. Such a current profile is highly advantageous for determining a translational velocity of the workpiece (not shown) through the ion beam 110 in order to provide a generally uniform dose of ions to the workpiece, thus evenly processing the workpiece. FIG. 3, for example, illustrates an exemplary ion beam 210 (e.g., viewing the ion beam 110 of FIG. 1 perpendicularly to the z-axis along the x-axis), wherein a charge or current distribution 205 across the ion beam is further illustrated in a graph 212 (e.g., a profile of the ion beam current along the x-axis). As can be seen in the graph 212, a center region 215 of the ion beam 200 has a greater beam current intensity than edges 220 of the ion beam, thus providing the generally bell-shaped curve 225 illustrated in the graph 212 of beam current versus position along the ion beam. While the curve 225 illustrated in FIG. 3 is generally symmetric about the center region 215 of the ion beam 210, it should be noted that the profile of the ion beam current is often not symmetric about the center region. Thus, in order to evenly process a workpieces (not shown) in the ion implantation system 100 of FIG. 1, for example, wherein an even implantation of ions across the workpiece is provided, a determination of the current profile across the ion beam is highly desirable. It should be further noted that the current distribution 205 of FIG. 3 of the ion beam 210 may or may not be similar in appearance for the x-direction and the y-direction, and such current distributions are largely a factor of the configuration of the ion beam formation system 120.

Figure 4A:
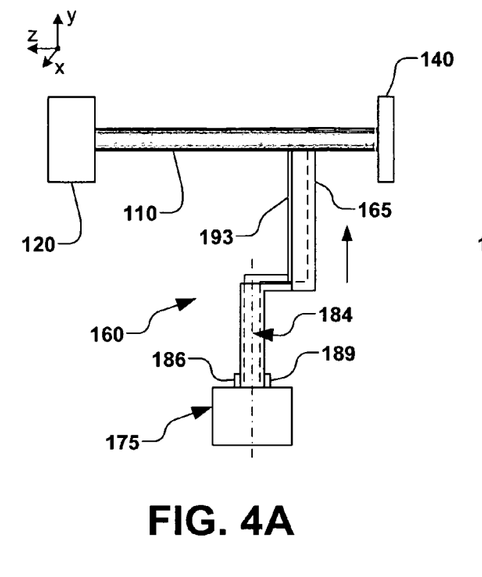
FIGS. 4A-4D are partial elevation views of an exemplary beam profiler apparatus in various positions for determining a beam profile in a first dimension according to another aspect of the present invention.
Figure 4B:
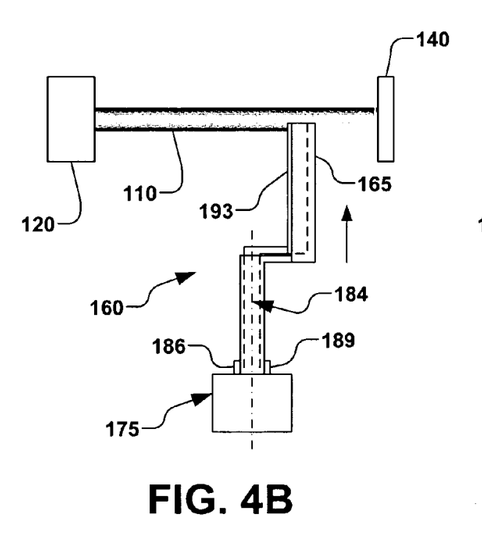
Figure 4C:
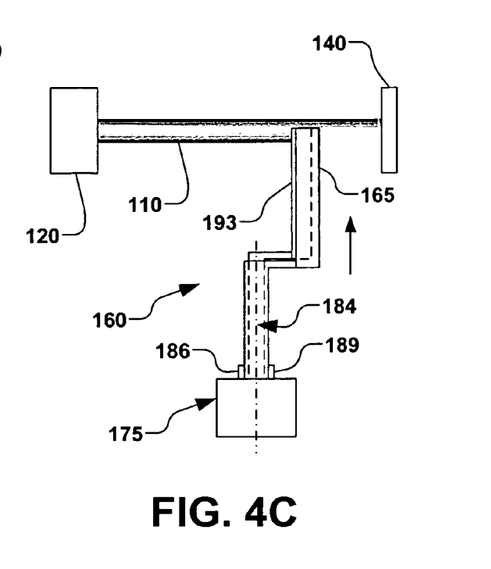
Figure 4D:
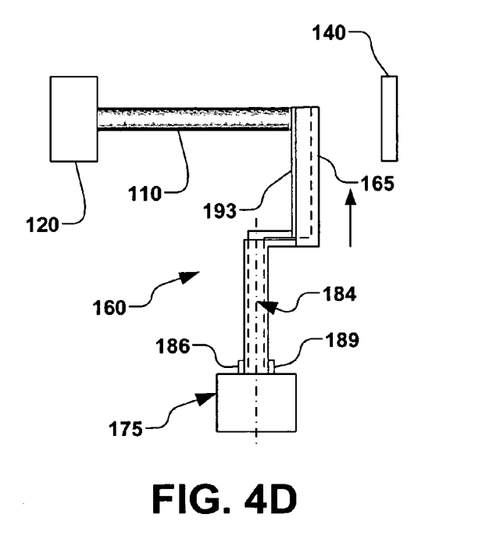
Figure 5A:
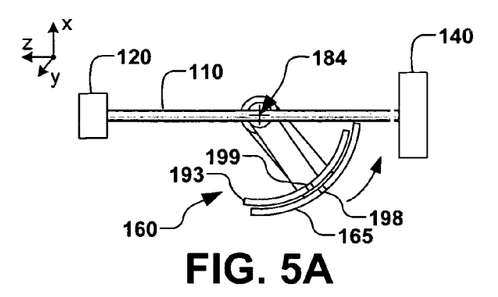
FIGS. 5A-5H are partial plan views of an exemplary beam profiler apparatus in various positions for determining a beam profile in a second dimension according to yet another exemplary aspect of the invention.
Figure 5B:
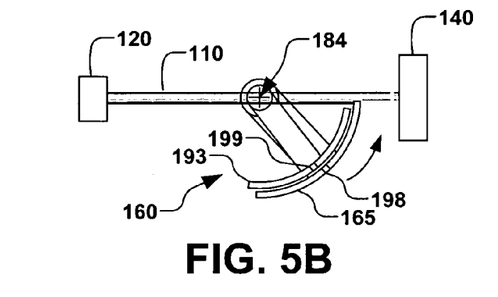
Figure 5C:
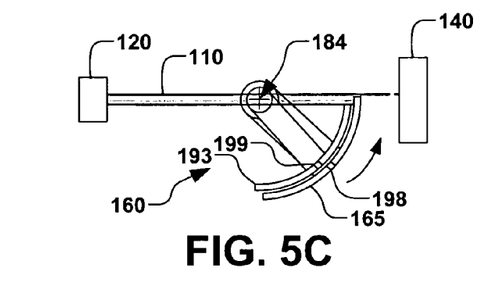
Figure 5D:
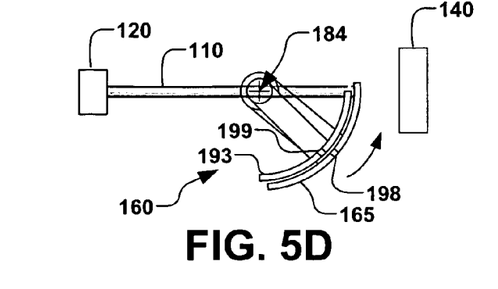
Figure 5E:
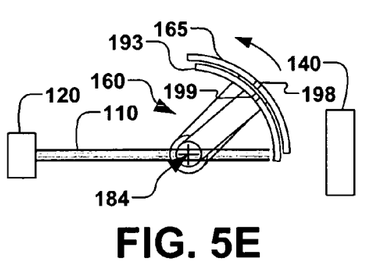
Figure 5F:
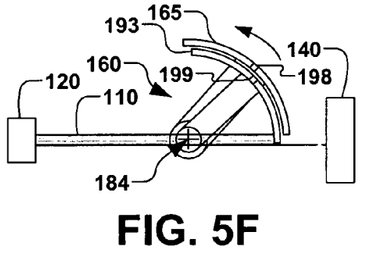
Figure 5G:
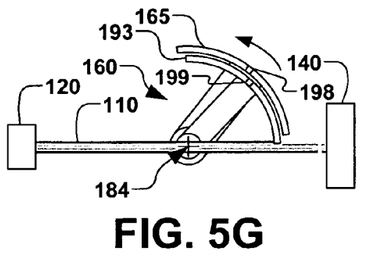
Figure 5H:
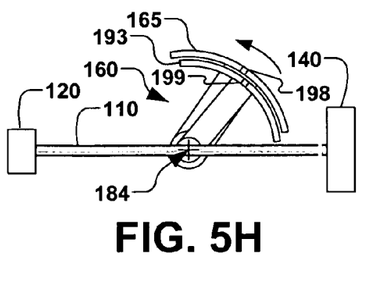

FIGS. 4A-4D illustrate the exemplary beam profiler 160 of FIG. 1 in various positions during a determination of the profile 191 of the ion beam 110 in a first direction (e.g., the y-direction). The first plate 165 and the second plate 193 of FIGS. 4A-4D, for example, are positioned with respect to one another about the first axis 184 such that they overlap (e.g., as illustrated in FIGS. 5A-5H), wherein the first aperture 198 and the second aperture 199 are generally mis-aligned, and wherein the ion beam cannot pass from the ion beam formation system 120 through both the first aperture and the second aperture. Alternatively, the second plate 193 may be omitted from the beam profiler, wherein the first plate 165 does not comprise the first aperture 198 (e.g., a generally solid first plate). In FIGS. 4A-4D, for example, the first plate 165 and the second plate 193 are progressively linearly translated along, or parallel to, the first axis 184 through the ion beam 110 via the linear actuator 186. In FIG. 4A, for example, the entire ion beam 110 is generally permitted to reach the measuring device 140. As the first plate 165 and second plate 193 progressively pass through the ion beam 110, as illustrated in FIGS. 4C-4D, the ion beam is progressively blocked, and the corresponding beam currents are sensed by the measuring device 140 and utilized by the controller 155 of FIG. 1 to determine the profile of the ion beam in the y-direction, similar to that shown in the graph 212 of FIG. 3. The linear position 190 of FIG. 1 of the first plate 165 and/or second plate 193 ascertained by the linear encoder 189, for example, can be utilized by the controller 155 to determine the profile 191 of the ion beam 110 at the workpiece plane 170.

Referring now to FIGS. 5A-5H, the exemplary beam profiler 160 of FIG. 1 is further illustrated in various positions during a determination of the profile 191 of the ion beam 110 in a second direction (e.g., the x-direction). Again, the first plate 165 and the second plate 193 are rotated about the first axis 184 such that they overlap, as illustrated in FIGS. 5A-5H, wherein the first aperture 198 and the second aperture 199 are generally mis-aligned, and wherein the ion beam cannot pass from the ion beam formation system 120 through both the first aperture and the second aperture. Again, as an alternative, the second plate 193 may be omitted from the beam profiler, wherein the first plate 165 also does not comprise the first aperture 198. As illustrated in FIGS. 5A-5D, the first plate 165 and the second plate 193 are rotated together about the first axis 184, wherein the ion beam 110 is progressively blocked from reaching the measuring device 140. In FIGS. 5E-5H, the ion beam 110 is progressively unblocked from reaching the measuring device 140 by the further rotation of the first plate 165 and second plate 193 past the ion beam. Such a progressive blocking and/or unblocking of the ion beam 110, for example, provides varying beam currents to the controller 155 of FIG. 1, wherein the controller is operable to determine the profile 191 of the ion beam in the second direction, such as that shown in the graph 212 of FIG. 3. The first rotational position 188 of the first plate 165 and/or the second rotational position 197 of the second plate 193 of FIG. 1, for example, may be further utilized by the controller 155 in the determination of the profile 191 of the ion beam 110. It should be further noted that the determination of the profile 191 of the ion beam 110 can be determined by progressively blocking, unblocking, or both blocking and unblocking the ion beam as it travels along the ion beam path 145.

Figure 6A:
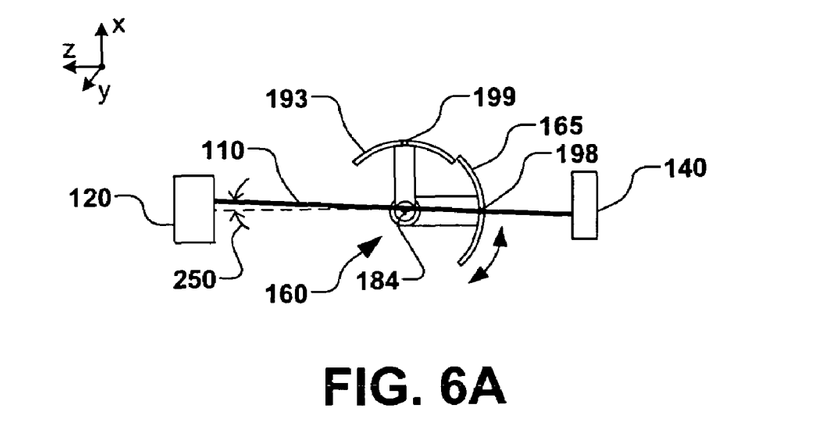
FIGS. 6A-6C are partial plan views of an exemplary beam profiler apparatus in various positions for determining a tilt angle of the ion beam according to another exemplary aspect of the invention.
Figure 6B:
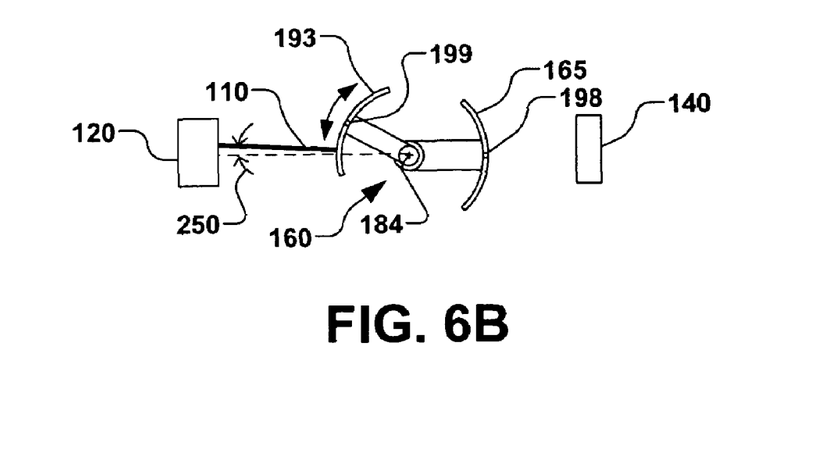
Figure 6C:
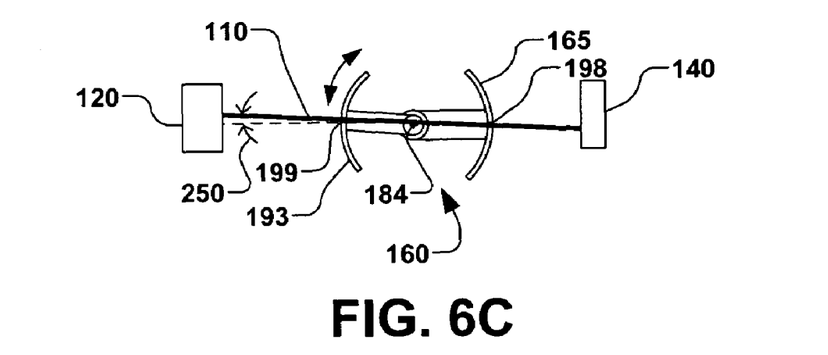

FIGS. 6A-6C illustrate another exemplary aspect of the invention, wherein the tilt angle 250 of the ion beam 110 (in the x-direction) can be determined using the beam profiler 160. As illustrated in FIG. 6A, the first plate 165 and the second plate 193 are rotated about the first axis 184 such that the ion beam 110 only passes through the first aperture 198 of the first plate. The first plate 165, for example, may be rotated such that the beam current sensed by the measuring device 140 is maximized, therein providing an optimal beam current for determining the tilt angle. In FIGS. 6B-6C, the second plate 193 is progressively rotated until the ion beam 110 passes through the second aperture 199 associated therewith, wherein second plate is generally opposed to first plate 165. Accordingly, as illustrated in FIG. 1, the first rotational position 188 from the first encoder 187 and the second rotational position 197 from the second encoder 196 can be utilized by the controller 155, in conjunction with a known separation of the first aperture 198 and the second aperture 199 at the first rotational position and second rotational position, in order to determine the tilt angle 250 (in the x-direction) of the ion beam 110.

Figure 7:
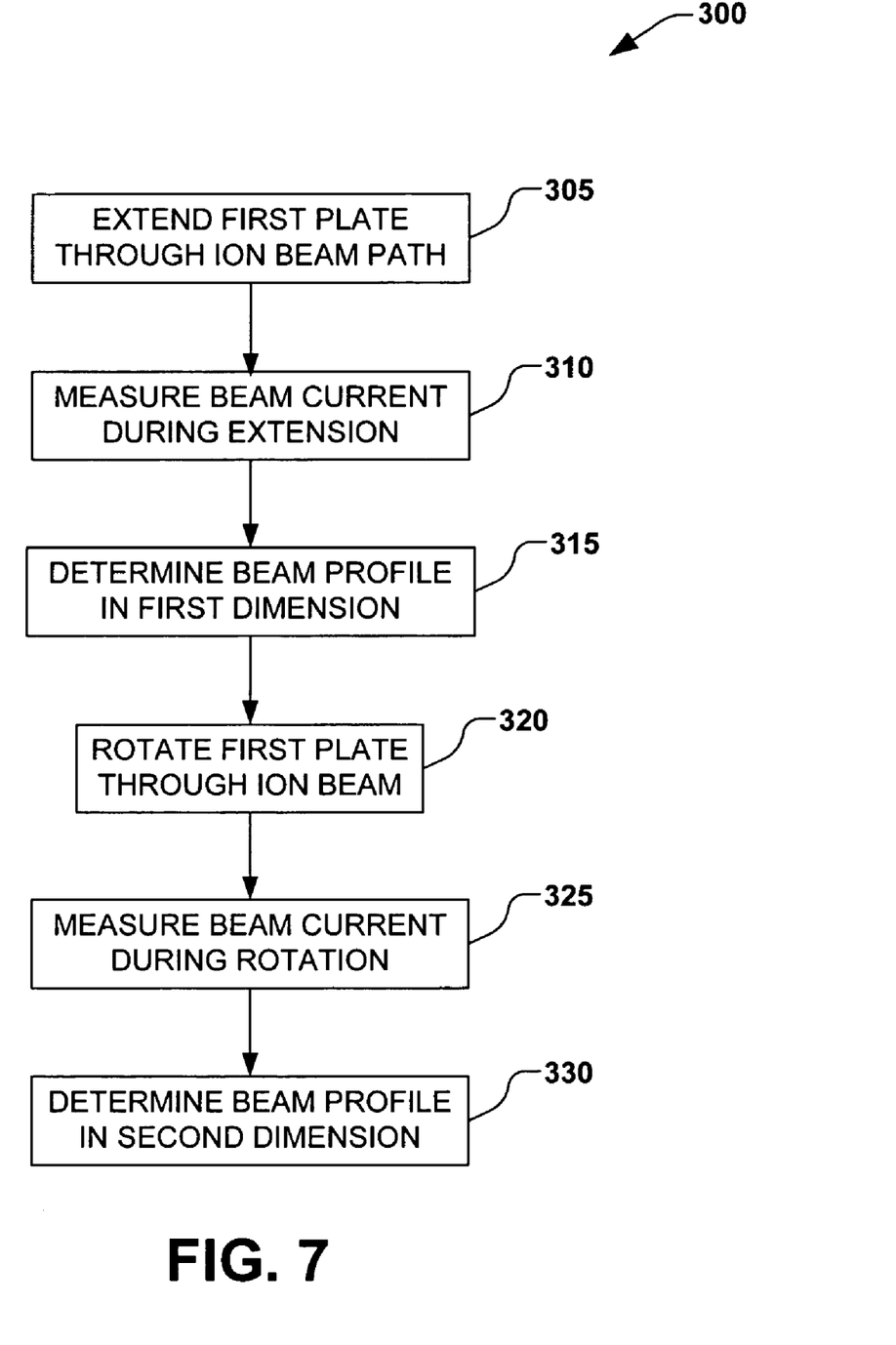
FIG. 7 is a block diagram of a method for determining an ion beam profile according to another exemplary aspect of the invention.

According to still another exemplary aspect of the present invention, FIG. 7 is a schematic block diagram of an exemplary method 300 illustrating the integration and operation of the exemplary ion beam profiling apparatus of FIGS. 1-6. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 7, the method 300 begins with act 305, wherein a first plate is extended along, or parallel to, a first axis through a path of the ion beam. For example, the first plate is extended along or near a workpiece plane through the path of the ion beam. In act 310, a current of the ion beam is measured during the extension of the first plate through the path of the ion beam, and in act 315, a beam current profile of the ion beam in the vertical direction (y-direction) is determined, based at least in part, on the measured beam current during the extension of the first plate through the ion beam.

In act 320, the first plate is rotated about the first axis through the path of the ion beam, and in act 325, the current of the ion beam is measured during the rotation of the first plate through the path of the ion beam. In act 330, a beam current profile of the ion beam in the horizontal direction (x-direction) is determined, based, at least in part, on the measured beam current during the rotation of the first plate through the ion beam.

Figure 8:
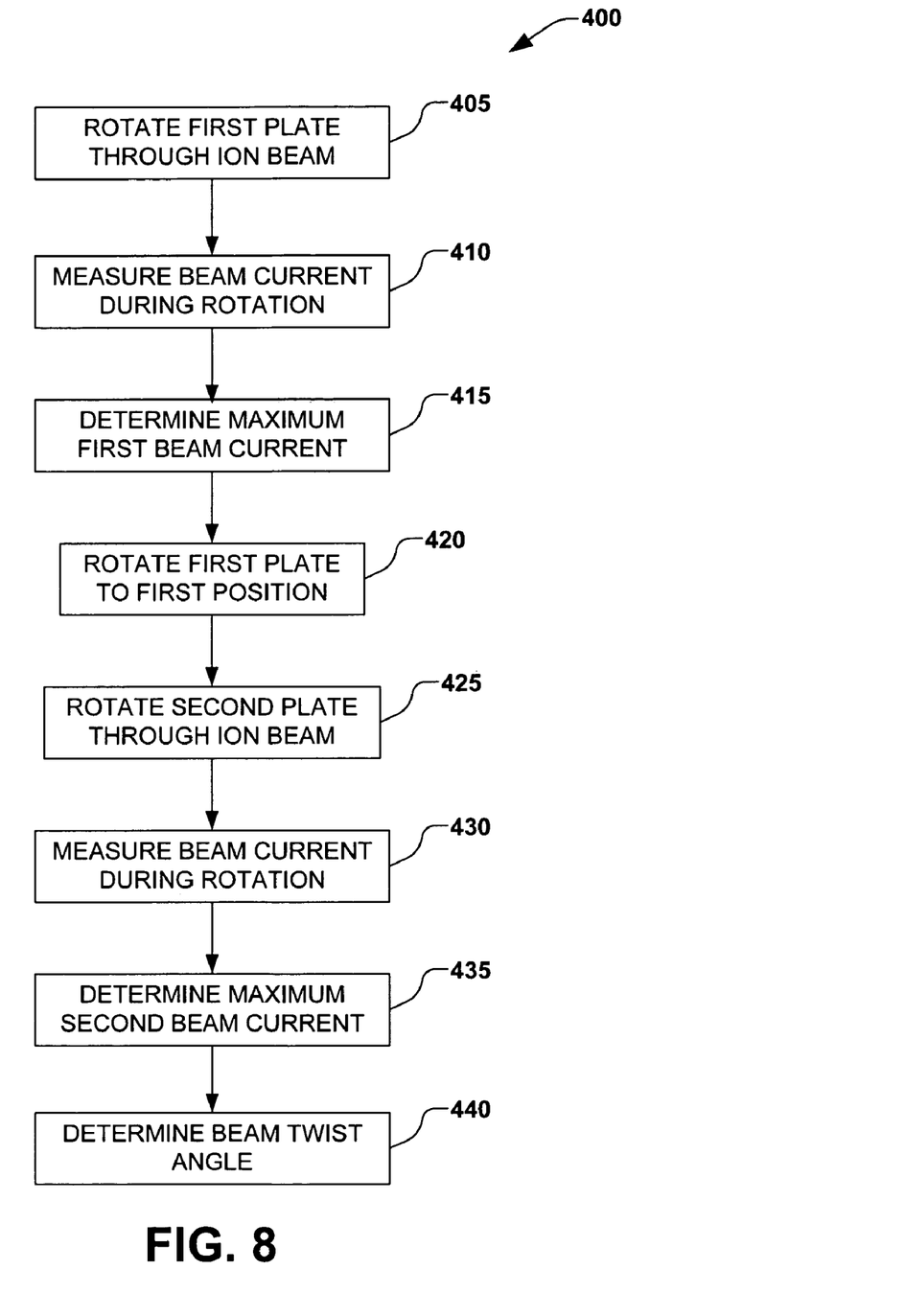
FIG. 8 is a block diagram of a method for determining a twist angle of an ion beam according to another exemplary aspect of the invention.

FIG. 8 illustrates another method 400 for determining a tilt angle of the ion beam with respect to the workpiece plane. The method 400 begins with act 405, wherein the first plate is rotated through the ion beam, and wherein a first aperture associated with the first plate selectively permits the ion beam to pass therethrough, based on the rotational position of the first plate with respect to the ion beam. The current of the ion beam is measured in act 410 during the rotation of the first plate, and in act 415, a maximum first current of the ion beam when the ion beam passes through the first aperture is determined, wherein the maximum first current is associated with a first position of the first plate. The first plate is rotated into the first position in act 420, and in act 425, a second plate is rotated through the ion beam, wherein a second aperture associated with the second plate selectively permits the ion beam to pass therethrough when the ion beam passes through the first aperture. In act 430, the current of the ion beam is measured during the rotation of the second plate, and in act 435, a maximum second current of the ion beam is determined when the ion beam passes through the first aperture and the second aperture, and wherein the maximum second current is associated with a second position of the second plate. A horizontal tilt angle of the ion beam with respect to a known position of the ion beam is then determined in act 440, wherein the determination of the horizontal angle is based, at least in part, on the first position of the first plate and second position of the second plate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An apparatus for profiling an ion beam emitted from an ion source, the apparatus comprising:
a measuring device positioned along a path of the ion beam, wherein the measuring device is operable to detect a beam current of the ion beam;
a drive mechanism;
a first plate rotatably coupled to the drive mechanism, wherein the drive mechanism is operable to rotate the first plate about a first axis through a path of the ion beam, therein selectively blocking at least a portion of the ion beam from reaching the measuring device; and
a controller operable to determine a profile of the ion beam, wherein the determination is based, at least in part, on the detected beam current throughout the rotation of the first plate.

2. The apparatus of claim 1, wherein the drive mechanism comprises:
a first shaft operably coupled to the first plate; and
a first rotary motor rotatably coupled to the first shaft, wherein the first rotary motor is operable to selectively rotate the first shaft about the first axis.

3. The apparatus of claim 2, wherein the first rotary motor comprises a servo motor.

4. The apparatus of claim 2, further comprising a first rotary encoder associated with the first plate, wherein the first rotary encoder is operable to sense a rotational position of the first plate about the first axis.

5. The apparatus of claim 1, wherein the measuring device comprises a faraday cup.

6. An apparatus for profiling an ion beam emitted from an ion source, the apparatus comprising:
a measuring device positioned along a oath of the ion beam, wherein the measuring device is operable to detect a beam current of the ion beam;
a drive mechanism; and
a first plate rotatably coupled to the drive mechanism, wherein the drive mechanism is operable to rotate the first plate about a first axis through a path of the ion beam, therein selectively blocking at least a portion of the ion beam from reaching the measuring device, wherein the drive mechanism comprises:
a first shaft operably coupled to the first plate;
a first rotary motor rotatably coupled to the first shaft, wherein the first rotary motor is operable to selectively rotate the first shaft about the first axis; and
a linear actuator operably coupled to the first shaft, wherein the linear actuator is operable to selectively linearly translate the first plate through the ion beam along, or parallel to, the first axis.

7. The apparatus of claim 6, further comprising a linear encoder, wherein the linear encoder is operable to sense a linear position of the first plate associated with the first axis.

8. The apparatus of claim 6, wherein the linear actuator comprises a linear motor.

9. An apparatus for profiling an ion beam emitted from an ion source, the apparatus comprising:
a measuring device positioned along a path of the ion beam, wherein the measuring device is operable to detect a beam current of the ion beam;
a drive mechanism;
a first plate rotatably coupled to the drive mechanism, wherein the drive mechanism is operable to rotate the first plate about a first axis through a path of the ion beam, therein selectively blocking at least a portion of the ion beam from reaching the measuring device; and
a second plate rotatably coupled to the drive mechanism, wherein the drive mechanism is further operable to rotate the second plate about the first axis through the path of the ion beam independently from the rotation of the first plate, therein further selectively blocking at least another portion of the ion beam from reaching the measuring device.

10. The apparatus of claim 9, wherein the drive mechanism further comprises:
a second shaft operably coupled to the second plate; and
a second rotary motor rotatably coupled to the second shaft, wherein the second rotary motor is operable to selectively rotate the second plate about the first axis.

11. The apparatus of claim 10, wherein the second rotary motor comprises a servo motor.

12. The apparatus of claim 10, further comprising a second rotary encoder associated with the second plate, wherein the second rotary encoder is operable to sense a rotational position of the second plate about the first axis.

13. The apparatus of claim 10, wherein the drive mechanism further comprises a linear actuator operably coupled to the first plate and the second plate, wherein the linear actuator is operable to selectively linearly translate the first plate and second plate along the first axis.

14. The apparatus of claim 13, further comprising a linear encoder, wherein the linear encoder is operable to sense a linear position of the first plate and second plate along the first axis.

15. The apparatus of claim 13, wherein the linear actuator comprises a linear motor.

16. The apparatus of claim 9, wherein the first plate comprises a first aperture defined therein, and wherein the second plate comprises a second aperture defined therein, wherein the first aperture and second aperture are rotatable through the path of the ion beam.

17. The apparatus of claim 16, wherein the first aperture and second aperture each comprise an elongate aperture extending generally parallel with the first axis.

18. A method for profiling an ion beam, the method comprising:
extending a first plate along or parallel to a first axis through a path of the ion beam, wherein the first axis is generally perpendicular to the path of the ion beam;
measuring a current of the ion beam during the extension of the first plate through the path of the ion beam along the first axis, therein determining a current profile of the ion beam in a first dimension;
rotating the first plate about the first axis through the path of the ion beam; and
measuring the current of the ion beam during the rotation of the first plate through the path of the ion beam, therein determining a profile of the ion beam in a second dimension.

19. The method of claim 18, further comprising:
a first aperture associated with the first plate, wherein rotating the first plate through the ion beam selectively permits the ion beam to pass through the first aperture;
determining a maximum first current of the ion beam when the ion beam passes through the first aperture, wherein the maximum first current is associated with a first position of the first plate;

rotating the first plate to the first position;
rotating a second plate through the ion beam, wherein a second aperture associated with the second plate selectively permits the ion beam to pass therethrough when the ion beam passes through the first aperture;
measuring the current of the ion beam during the rotation of the second plate;
determining a maximum second current of the ion beam when the ion beam passes through the first aperture and the second aperture, wherein the maximum second current is associated with a second position of the second plate; and
determining a horizontal angle of the ion beam with respect to a known position of the ion beam, wherein the determination of the horizontal angle is based, at least in part, on the first position of the first plate and second position of the second plate.

20. An ion implantation system, comprising:
an ion source operable to form an ion beam and implant ions into a workpiece, wherein the workpiece is selectively positioned along a workpiece plane;
a measuring device positioned along a path of the ion beam, wherein the measuring device is operable to detect a beam current the ion beam;
an ion beam profiler, comprising a first plate rotatably coupled to a drive mechanism, wherein the drive mechanism is operable to rotate the first plate about a first axis through a path of the ion beam, therein selectively blocking at least a portion of the ion beam from reaching the measuring device; and
a controller operable to determine a profile of the ion beam at the workpiece plane, wherein the determination is made based, at least in part, on the detected beam current.

21. The system of claim 20, wherein the drive mechanism comprises:
a first shaft operably coupled to the first plate;
a first rotary motor rotatably coupled to the first shaft, wherein the first rotary motor is operable to selectively rotate the first shaft about the first axis; and
a first rotary encoder associated with the first plate, wherein the first rotary encoder is operable to sense a first rotational position of the first plate about the first axis, and wherein the determination of the profile of the ion beam is further based on the sensed first rotational position of the first plate.

22. The system of claim 20, wherein the drive mechanism further comprises a linear actuator and a linear encoder operably coupled to the first shaft, wherein the linear actuator is operable to selectively linearly translate the first plate along the first axis, and wherein the linear encoder is operable to sense a linear position of the first plate associated with the first axis.

23. The system of claim 20, further comprising a second plate rotatably coupled to the drive mechanism, wherein the drive mechanism is further operable to rotate the second plate about the first axis through the path of the ion beam independently from the rotation of the first plate, therein further selectively blocking at least another portion of the ion beam from reaching the measuring device.

24. The system of claim 23, wherein the drive mechanism further comprises:
a second shaft operably coupled to the second plate;
a second rotary motor rotatably coupled to the second shaft, wherein the second rotary motor is operable to selectively rotate the second plate about the first axis; and
a second rotary encoder associated with the second plate, wherein the second rotary encoder is operable to sense a second rotational position of the second plate about the first axis, and wherein the determination of the profile of the ion beam is further based on the sensed second rotational position of the second plate.

25. The system of claim 24, wherein the first plate comprises a first aperture defined therein, and wherein the second plate comprises a second aperture defined therein, wherein the first aperture and second aperture are rotatable through the path of the ion beam, and wherein the controller is further operable to determine a twist angle of the ion beam based, at least in part, on the first rotational position, the second rotational position, and a known position of the ion beam.

* * * * *

UNITED STATES PATENT AND TRADEMARK OFFICE
CERTIFICATE OF CORRECTION

| | |
|---|---|
| PATENT NO. | : 7,381,977 B2 |
| APPLICATION NO. | : 11/235754 |
| DATED | : June 3, 2008 |
| INVENTOR(S) | : John D. Pollock et al. |

Page 1 of 1

It is certified that error appears in the above-identified patent and that said Letters Patent is hereby corrected as shown below:

Claim 6, column 9, line 40: Please replace the word "oath" with the word --path--.

Signed and Sealed this

Twenty-ninth Day of July, 2008

JON W. DUDAS
*Director of the United States Patent and Trademark Office*